United States Patent [19]
Sei et al.

[11] Patent Number: 6,093,942
[45] Date of Patent: Jul. 25, 2000

[54] SEMICONDUCTOR DEVICE WITH IMPROVED PAD LAYOUT

[75] Inventors: Toshikazu Sei; Yasunobu Umemoto, both of Kawasaki, Japan

[73] Assignee: Kabushiki Kaisha Toshiba, Kawasaki, Japan

[21] Appl. No.: 09/305,472

[22] Filed: May 6, 1999

[30] Foreign Application Priority Data

May 7, 1998 [JP] Japan .................................. 10-124555

[51] Int. Cl.[7] ................................................ H01L 27/118
[52] U.S. Cl. .......................................... 257/203; 257/207
[58] Field of Search ..................... 257/203, 207, 257/204, 205, 206, 208, 209, 210, 211

[56] References Cited

FOREIGN PATENT DOCUMENTS

563973 A2   10/1993   United Kingdom ................... 257/203

Primary Examiner—David Hardy
Assistant Examiner—Lourdes Cruz
Attorney, Agent, or Firm—Oblon, Spivak, McClelland, Maier & Neustadt, P.C.

[57] ABSTRACT

First I/O signal pads are arranged along the periphery of a semiconductor chip except corner sections thereof at a first pitch, and second I/O signal pads and power supply pads are arranged in the corner sections of the semiconductor chip. In this case, the second I/O signal pads and the power supply pads are alternately arranged at the first pitch, and arrangement of the power supply pads are set so that the pads are located at fixed sites common to semiconductor chips. With this arrangement, the second I/O signal pads are arranged at a pitch wider than the first pitch.

17 Claims, 3 Drawing Sheets

SEMICONDUCTOR DEVICE WITH IMPROVED PAD LAYOUT

BACKGROUND OF THE INVENTION

The present invention relates to a semiconductor device and particularly to a pad layout in a semiconductor device (chip).

Heretofore, in a semiconductor device, die sort (selection of chips) has generally been conducted while a probe is put into contact with dice prior to separation of semiconductor integrated circuits formed on a wafer into chips. In this die sort operation, when chip sizes are same as one another, the same probe can be used in common on different dice by using the same pad layout and aligning sites of power supply pads among chips, regardless of a difference in design.

In a kind of circuit which uses a master with a predetermined pad layout like an ASIC, for example, there are a number of products which share the same chip size and same pad layout even though they employ different designs. Therefore, since the same probe can be used in common on a number of ASIC chips, the merit is great.

However, arrangement of power supply pads is different according to specifications of a product in other kinds of circuit. Accordingly, there are no pads to be specifically used for power supply which are common in all products; In the current situation, a pad which is used as a power supply pad in a product is used as a signal pad-or an NC (nonconnective) pad in another product.

Therefore, generally, in addition to general purpose pads whose application can be selected for either power supply, an I/O signal or the like, pads exclusive to power supply are provided. FIG. 1 is a layout showing an example of construction and arrangement of pads in a conventional chip. As shown in FIG. 1, power supply pads 42 are arranged in the in vicinity of a corner section of a chip 40. General purpose pads 44 are arranged around the middle section of the chip 40 along the periphery thereof. When the general purpose pads 44 are I/O signal pads, the pads are respectively connected to I/O circuits 46.

In this way, the reason why power supply pads 42 are arranged in the vicinity of a corner section of the chip 40 is that when pads are located in the vicinity of a corner section, an area for forming transistors of an I/O circuit cannot be secured in an adjacent manner to each of the pads. In this case, while all power supply pads cannot take the same arrangement, at least power supply pads which are located in the vicinity of a corner section take the same arrangement. Hence, one probe for testing can commonly be used for a plurality of products.

In the construction and arrangement of pads as shown in FIG. 1, however, when connection between pads on the chip side and pins on the package side are performed by bonding with a metal wire, generally bonding is comparatively easy around the middle section of the chip along the periphery thereof, whereas bonding in the vicinity of a corner section of the chip is hard to perform. This is a problem that is caused due to a wider pitch in arrangement of pins on the package side than that of pads on the chip side.

Therefore, a method has sometimes been employed in which general purpose pads in the vicinity of a corner section of the chip are located at sites as remote from areas where transistors of the I/O circuits are formed as possible and power supply pads are not located in the vicinity of a corner section of a chip.

FIG. 2 is a layout showing such a construction and arrangement of pads. As shown in FIG. 2, in the vicinity of a corner section of the chip 50, general purpose pads 54 are arranged at a wide pitch at sites as remote from the areas where transistors of the I/O circuits 52 are formed as possible. General purpose pads 56 are arranged around the middle section of the chip 50 along the periphery thereof except the vicinity of a corner section thereof. In this case, however, a probe cannot commonly be used.

BRIEF SUMMARY OF THE INVENTION

The present invention has been made in light of the above described problem and it is accordingly an object of the present invention to provide a semiconductor device in which not only is an arrangement pitch of pads which require actual bonding in the vicinity of a corner section widened, but pads exclusive to power supply are also arranged in the vicinity of the corner section; and thereby, wire bonding to a pad arranged in the vicinity of the corner section of the chip can be effected with ease and furthermore, a probe for testing can be commonly used.

In order to achieve the object, a first aspect of the present invention is directed to a semiconductor device-comprising: power supply pads arranged in at least a corner section of a semiconductor chip; first general purpose pads arranged at a first pitch along the periphery of the semiconductor chip except the corner section thereof; and second general purpose pads arranged in an adjacent manner to the power supply pads in the corner section at a second pitch wider than the first pitch.

According to such a semiconductor device as is constructed in this way, not only can an arrangement pitch of pads which require actual boding in the vicinity of a corner section be widened, but power supply pads can also be formed in the vicinity of the corner section. Hence, wire bonding to a pad arranged in the vicinity of a corner section of the chip can be effected with ease and in addition, a probe for testing can commonly be used.

In order to achieve the object, a second aspect of the present invention is directed to a semiconductor device comprising: power supply pads arranged in a corner section of a semiconductor chip; cells arranged at a first pitch along the periphery of the semiconductor chip; first general purpose pads arranged at the first pitch along the periphery of the semiconductor chip except the corner section thereof in a corresponding manner to the cells, and connected to the cells; and second general purpose pads arranged in an adjacent manner to the power supply pads in the corner section at a second pitch wider than the first pitch.

According to such a semiconductor as is constructed in this way, not only can an arrangement pitch of pads which requires actual boding in the vicinity of a corner section be widened, but power supply pads can also be formed in the vicinity of the corner section. Hence, wire bonding to a pad arranged in the vicinity of a corner section of the chip can be effected with ease and in addition, a probe for testing can commonly be used.

In order to achieve the object, a third aspect of the present invention is directed to a semiconductor device comprising: signal circuits and power supply circuits which are arranged along the periphery of a semiconductor chip; power supply pads arranged in a corner section of the semiconductor chip, and connected to the power supply circuits; first general purpose pads arranged along the periphery of the semiconductor chip except the corner section thereof in a corresponding manner to the signal circuits and power supply circuits, and connected to one of the signal circuits and the power supply circuits; and second general purpose pads arranged in an adjacent manner to the power supply pads in the corner section.

According to such a semiconductor as is constructed in this way, not only an arrangement pitch of pads which require actual bonding in the vicinity of a corner section can be widened, but power supply pads can also be formed in the vicinity of the corner section. Hence, wire bonding to a pad arranged in the vicinity of a corner section of the chip can be effected with ease and in addition, a probe for testing can commonly be used.

In order to achieve the object, a fourth aspect of the present invention is directed to a semiconductor device comprising: power supply pads, arranged in a corner section of a semiconductor chip, and connected to power supply interconnects; first general purpose pads arranged at a first pitch along the periphery of the semiconductor chip except the corner section thereof, and connected to one of signal circuits and power supply circuits; and second general purpose pads arranged in an adjacent manner to the power supply pads in the corner section at a second pitch wider than the first pitch, and connected to one of signal circuits and power supply circuits.

According to such a semiconductor as is constructed in this way, not only can an arrangement pitch of pads which require actual bonding in the vicinity of a corner section be widened, but power supply pads can also be formed in the vicinity of the corner section. Hence, wire bonding to a pad arranged in the vicinity of a corner section of the chip can be effected with ease and in addition, a probe for testing can commonly be used.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Below, embodiments of the present invention will be described with reference to the accompanying drawings.

[First Embodiment]

First of all, a semiconductor device of the first embodiment of the present invention will be described.

Figure 1:
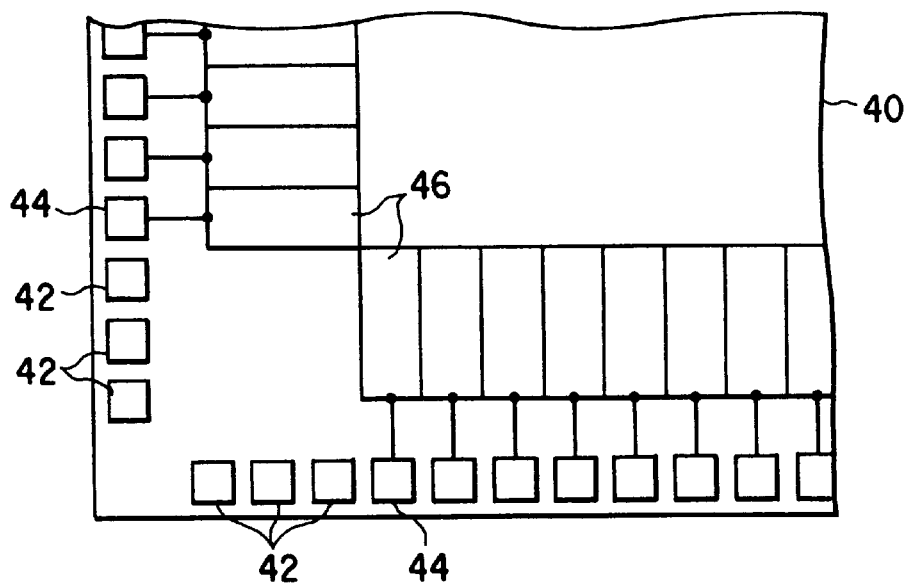
FIG. 1 is a layout showing an example of construction and arrangement of pads in a conventional semiconductor chip.
Figure 2:
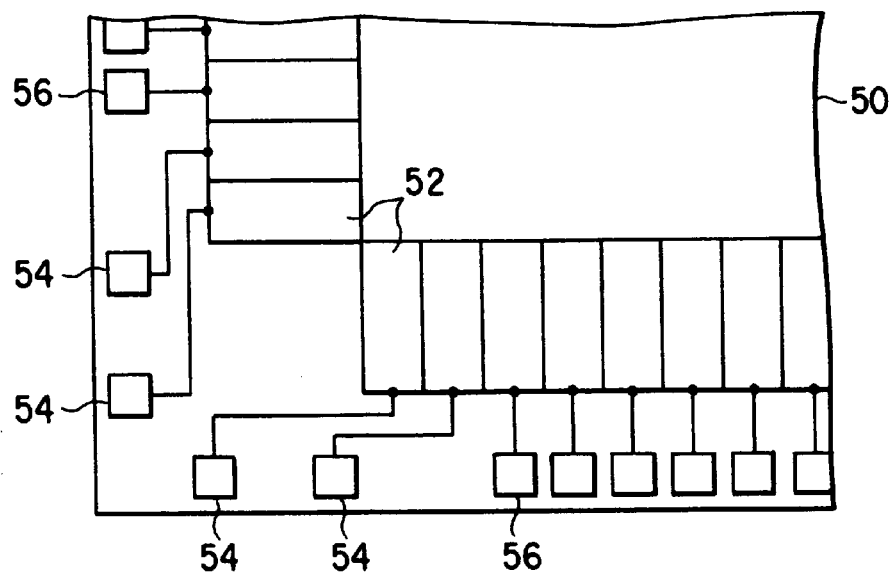
FIG. 2 is a layout showing another example of construction and arrangement of pads in a conventional semiconductor chip.
Figure 3:
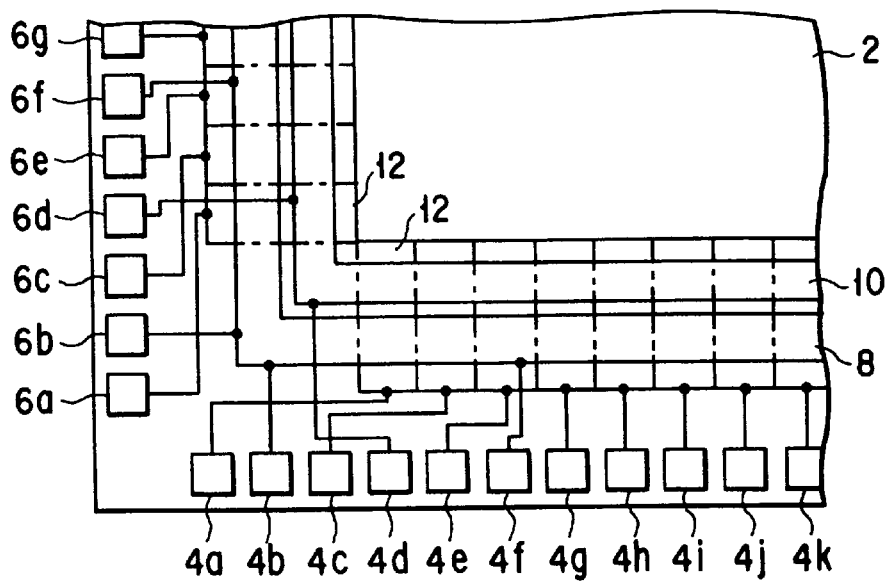
FIG. 3 is a layout showing a construction and arrangement of pads in a corner section of a semiconductor device of a first embodiment.

FIG. 3 is a layout showing a construction and arrangement of pads in a corner section of a semiconductor device of the first embodiment according to the present invention.

The first embodiment is provided with general purpose pads, which can be selected for an I/O signal use or a power supply use, and power supply pads in the vicinity of a corner section of a semiconductor device (chip) in which an integrated circuit is formed. Besides, in the first embodiment, an arrangement pitch of general purpose pads in the vicinity of a corner section is designed to be wider than that of general purpose pads arranged at sites except the vicinity of the corner section. The term, the vicinity of a corner section, means an area on a chip in the vicinity of the corner, in which bonding is harder to perform than in an area around the middle section of a side of the chip along the periphery thereof, since when pads on the chip side and pins on the package side are connected by wire bonding, the pins on the package side have a wider pitch than that of the pads on the chip side.

As shown in FIG. 3, pads $4a, 4b, 4c, \ldots 4j, 4k, \ldots$, which are terminals of a integrated circuit, are arranged at a predetermined pitch in the vicinity of a corner section of a semiconductor device (hereinafter referred to as chip) 2, in which the integrated circuit is formed, along one side thereof. The first, third and fifth pads $4a, 4c, 4e$ from the corner vertex are general purpose pads which can selectively be used for an I/O signal or power supply and, in the figure, shown as those for I/O signals. The second, fourth and sixth pads $4b, 4d, 4f$ from the corner vertex are exclusively used for power supply. The pads $4g$ to $4k$ are general purpose pads which can selectively be used for an I/O signal or power supply and, in the figure, shown as those for I/O signals.

Pads $6a, 6b, 6c, \ldots 6f, 6g, \ldots$, which are terminals of the integrated circuit, are arranged at a predetermined pitch in the vicinity of the corner section along the other side thereof. The first, third and fifth pads $6a, 6c, 6e$ from the corner vertex are general purpose pads which can selectively be used for an I/O signal or power supply and, in the figure, shown as those for I/O signals. The second, fourth and sixth pads $6b, 6d, 6f$ from the corner vertex are exclusively used for power supply.

A VDD pattern 8 from which a power supply voltage VDD is supplied and a VSS pattern 10 from which a reference voltage VSS is supplied are formed on the chip 2. In addition, I/O circuits 12 each comprising transistors and the like are formed inside the pads arranged on the chip 2.

Along the one side of the corner section, the I/O signal pads $4a, 4c, 4e$ in the vicinity of the corner section and the I/O signal pads $4g$ to $4k$ around the middle section of the one side thereof are respectively connected to the I/O circuits 12 through interconnects of a metal such as Al. Likewise, along the other side of the corner section, the I/O signal pads $6a, 6c, 6e$ in the vicinity of the corner section and the I/O signal pads $6g$ around the middle section of the other side thereof are respectively connected to the I/O circuits 12 through interconnects of a metal such as Al.

Along the one side of the corner section, the power supply pads $4b, 4f$ in the vicinity of the corner section are connected to the VDD pattern 8 through interconnects of a metal such as Al. The power supply pad $4d$ in the vicinity of the corner section is connected to the VSS pattern 10 through an interconnect of a metal such as Al. Likewise, along the other side of the corner section, the power supply pads $6b, 6f$ in the vicinity of the corner section are connected to the VDD pattern 8 through interconnects of a metal such as Al. The power supply pad 6d in the vicinity of the corner section is connected to the VSS pattern 10 through an interconnect of a metal such as Al.

That is, in the first embodiment, the power supply pads 4b, 4d, 4f are arranged in an adjacent manner to the I/O signal pads 4a, 4c, 4e which are assigned for the use in input and output in the vicinity of the corner section of the chip 2. In addition, the pads 4a, 4c, 4e and the pads 4b, 4d, 4f are alternately arranged. Likewise, the power supply pads 6b, 6d, 6f are arranged in an adjacent manner to the I/O signal pads 6a, 6c, 6e. In addition, the pads 6a, 6c, 6e and the pads 6b, 6d, 6f are alternately arranged.

In this way, the I/O signal pads which require bonding with a metal wire and the power supply pads which do not necessarily require bonding with a metal wire are alternatively arranged and thereby, a space between adjacent I/O signal pads is widened so as to enable bonding with a metal wire to be easily performed. Besides, with arrangement of power supply pads at the same sites in the vicinity of a corner section of a chip, a probe which is used for testing or the like can commonly be used. Part of general purpose pads at sites except the vicinity of a corner section of the chip (in the middle section of the chip) is used for power supply pads in a corresponding manner to the number of the I/O signal pads arranged in the vicinity of a corner section of the chip.

As described above, according to the first embodiment, not only can an arrangement pitch of the I/O signal pads which require actual bonding be widened, but the power supply pads can also be formed in the vicinity of a corner section of the chip, without widening an arrangement pitch of pads. Hence, wire bonding on a pad arranged in the vicinity of a corner section can be effected with ease and furthermore, a probe for testing can commonly be used.

In the mean time, in this first embodiment, arrangement of pads in the vicinity of a corner section may be at the same pitch or at different pitches. In addition, in the embodiment, pads located at odd-numbered positions from a corner vertex are used as I/O signal pads and pads located at even-numbered positions from the corner vertex are used as power supply pads. However, there is no specific limitation to the case, but pads located at odd-numbered positions from the corner vertex may be used as power supply pads and pads located at even-numbered positions may be used as I/O signal pads.

[Second Embodiment]

Then, a semiconductor device of the second embodiment of the present invention will be described.

Figure 4:
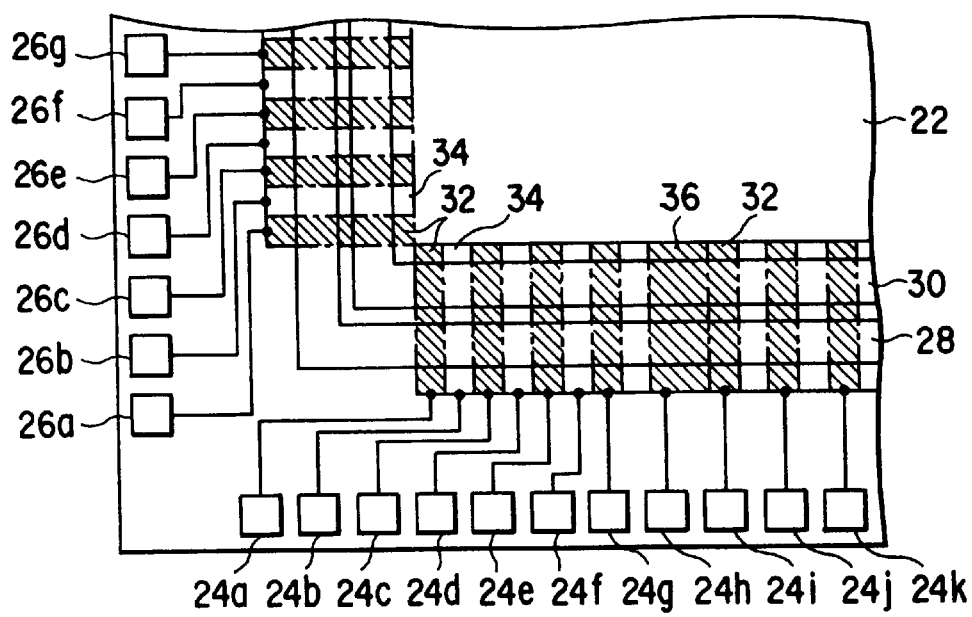
FIG. 4 is a layout showing a construction and arrangement of pads in a corner section of a semiconductor device of a second embodiment.

FIG. 4 is a layout showing a construction and arrangement of pads in a corner section of a semiconductor device of the second embodiment according to the present invention.

In the first embodiment, the case is described where pads and I/O circuits are arranged at the same pitch. In the second embodiment, the case will be described where I/O circuits and power supply circuits are alternately arranged and pads are arranged at twice as wide a pitch as an arrangement pitch of the I/O circuits and the power supply circuits.

In the second embodiment, like the first embodiment, general purpose pads, which can selectively be used as an I/O signal pad or a power supply pad, and power supply pads are arranged in the vicinity of a corner section of a semiconductor device (chip) in which an integrated circuit is formed. Besides, an arrangement pitch of general purpose pads in the vicinity of an corner section is wider than that of general purpose pads at sites except the vicinity of the corner section. The term, the vicinity of an corner section, means an area in the vicinity of the corner of a chip in which bonding is harder to perform than in an area around the middle section of the chip along thereof, since when the pads on the chip side and the pins on the package side are connected by wire bonding, pins on the package side are wider in pitch than pads on the chip side, as is the above described.

As shown in FIG. 4, pads 24a, 24b, 24c, . . . , 24j, 24k, . . . , which are terminals of an integrated circuit, are arranged at a predetermined pitch in the vicinity of a corner section of the chip 22, in which the integrated circuit is formed, along one side thereof. The first, third and fifth pads 24a, 24c, 24e from the corner vertex are general purpose pads which can selectively be used as an I/O signal pad or a power supply pad and the pads here are shown as I/O signal pads. The second, fourth and sixth pads 24b, 24d, 24f from the corner vertex are power supply pads. Furthermore, the pads 24g to 24k are general purpose pads which can selectively be used as an I/O signal pad or a power supply pad and the pads here are shown as I/O signal pads.

Along the other side of the corner section in the vicinity thereof, the pads 26a, 26b, 26c, . . . , 26f, 26g, . . . , which are terminals of the integrated circuit, are arranged at a predetermined pitch. The first, third and fifth pads 26a, 26c, 26e from the corner vertex are general purpose pads which can selectively be used as an I/O signal pad or a power supply pad and the pads here are shown as I/O signal pads. The second, fourth and sixth pads 26b, 26d, 26f are power supply pads.

A VDD pattern 28 from which a power supply voltage VDD is supplied and a VSS pattern 30 from which a reference voltage VSS is supplied are formed on the chip 22. Furthermore, I/O circuits 32, constructed from transistors and the like, and connected to the I/O signal pads; power supply circuits 34 connected to the power supply pads; and an I/O circuit 36 connected to an I/O signal pad are formed inside the pads arranged on the chip 22. The power supply circuits connect power supply pads to the VDD pattern 28 or the VSS pattern 30. The I/O circuit 36 occupies twice as large an area as that of an I/O circuit 32 and constitutes a circuit with a high performance and a large current drive capability as compared with the I/O circuit 32.

Along the one side of the corner section, the I/O signal pads 24a, 24c, 24e in the vicinity of the corner section and the I/O signal pads 24g, 24i, 24j, 24k around the middle section are respectively connected to the I/O circuits 32 through interconnects of a metal such as Al. Furthermore, the I/O signal pad 24h is connected to the I/O circuit 36 through an interconnect of a metal such as Al. Likewise, along the other side of the corner section, the I/O signal pads 26a, 26c, 26e in the vicinity of the corner section and the I/O signal pad 26g around the middle section of the other side are respectively connected to the I/O circuits 32 through interconnects of a metal such as Al.

Along the one side of the corner section, the power supply pads 24b, 24d, 24f in the vicinity of the corner section are respectively connected to the power supply circuits 34 through interconnect of a metal such as Al. Likewise, along the other side of the corner section, the power supply pads 26b, 26d, 26f in the vicinity of the corner are respectively connected to the power supply circuits 34 through interconnects of a metal such as Al. The power supply circuits 34 are connected to the VDD pattern 28 or the VSS pattern 30.

That is, in this second embodiment, the power supply pads 24b, 24d, 24f are arranged in an adjacent manner to the I/O signal pads 24a, 24c, 24e which are assigned as pads for input and output in the vicinity of a corner section of the chip 22. In addition, the pads 24a, 24c, 24e and the pads 24b, 24d, 24f are alternately arranged. Likewise, the power supply pads 26b, 26d, 26f are arranged in an adjacent manner to the I/O signal pads 26a, 26c, 26e. Furthermore, the pads 26a, 26c, 26e and the pads 26b, 26d, 26f are alternately arranged.

In this way, the I/O signal pads which require bonding with a metal wire and the power supply pads which do not necessarily require bonding with a metal wire are alternately arranged and thereby, a space between adjacent I/O pads is widened so as to enable bonding with a metal wire to be easily performed. Besides, with arrangement of power supply pads at the same sites in the vicinity of a corner section of the chip, a probe which is used for testing or the like can commonly be used. Part of general purpose pads at sites except the vicinity of a corner section of the chip (in the middle section of the chip) is used for power supply pads in a corresponding manner to the number of the I/O signal pads arranged in the vicinity of a corner section of the chip.

Figure 5:
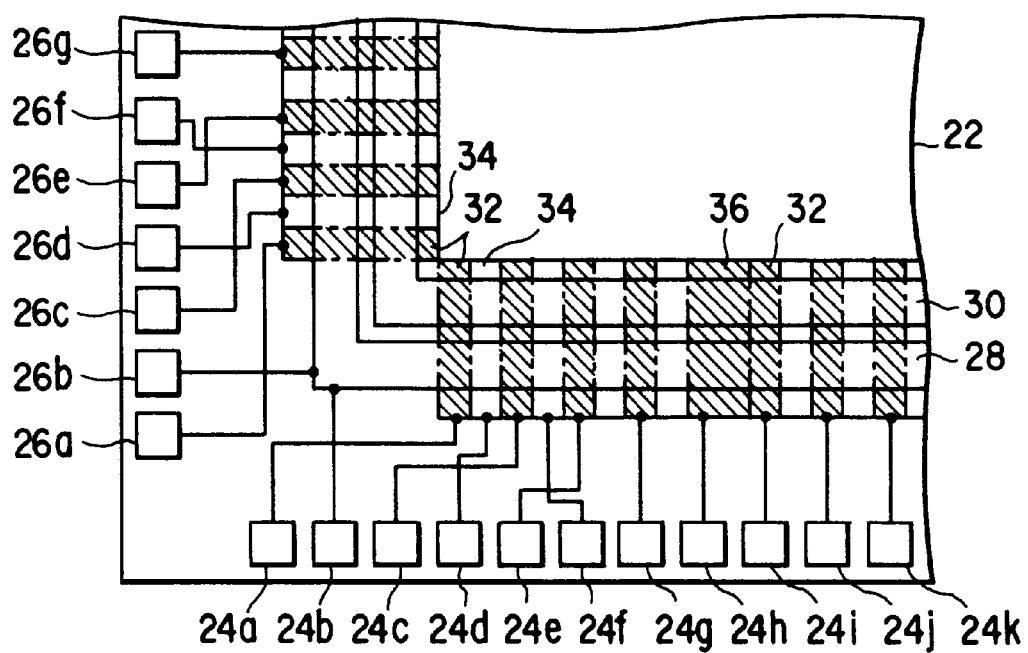
FIG. 5 is a layout showing a construction and arrangement of pads in a corner section of a semiconductor device of modification of the second embodiment.

As modification of the second embodiment, a construction and arrangement shown in FIG. 5 may be adopted. FIG. 5 is a layout showing a construction and arrangement of pads in a corner section of a semiconductor device of modification of the second embodiment according to the present invention.

While, in the second embodiment, the power supply pad 24b is connected to the power supply circuit 34, in the modification of the second embodiment, the power supply pads 24b, 26b are directly connected to the VDD pattern 28 as shown in FIG. 5. In company this, one circuit of the power supply circuits 34 to which the power supply pads 24d, 24f or 26d, 26f are connected becomes a circuit on the corner side. The other construction and arrangement are similar to those of the second embodiment.

As described above, according to the second embodiment and its modification, not only can an arrangement pitch of the I/O signal pads which require actual bonding be widened, but the power supply pads can also be formed in the vicinity of a corner section of the chip, without widening an arrangement pitch of pads. Hence, wire bonding on a pad arranged in the vicinity of a corner section can be effected with ease and furthermore, a probe for testing can commonly used.

In the mean time, while in this second embodiment and its modification, pads located at odd-numbered positions from the corner vertex are used as I/O signal pads and pads located at even-numbered positions from the corner vertex are used as power supply pads. However, there is no specific limitation to the case, but pads located at odd-numbered positions from the corner vertex may be used as power supply pads and pads located at even-numbered positions may be used as I/O signal pads. While the case is described where pads are arranged at twice as wide a pitch as an arrangement pitch of the I/O circuits and the power supply circuits, there is no specific limitation to this, but the present invention can be applied to the cases where pads are arranged at 2.5 times and 3.0 times as wide a pitch.

As described above, according to the present invention, a semiconductor device can be provided in which not only can an arrangement pitch of the pads which require actual bonding be widened, but the power supply pads can also be formed in the vicinity of a corner section of the chip and thereby, wire bonding on a pad arranged in the vicinity of a corner section of the chip can be effected with ease and furthermore, a probe for testing can commonly used.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:

power supply pads arranged in at least a corner section of a semiconductor chip;

first general purpose pads arranged at a first pitch along the periphery of the semiconductor chip except the corner section thereof; and second general purpose pads arranged in an adjacent manner to the power supply pads in the corner section at a second pitch wider than the first pitch.

2. A semiconductor device according to claim 1, wherein the power supply pads and the second general purpose pads are alternately arranged.

3. A semiconductor device according to claim 2, wherein the power supply pads and the second general purpose pads are arranged at the first pitch.

4. A semiconductor device according to claim 1, wherein the first and second general purpose pads are pads which are subjected to bonding with a wire and the power supply pads are pads which are not subjected to bonding with a wire.

5. A semiconductor device comprising:

power supply pads arranged in a corner section of a semiconductor chip;

cells arranged at a first pitch along a periphery of the semiconductor chip;

first general purpose pads arranged at the first pitch along the periphery of the semiconductor chip except the corner section thereof in a corresponding manner to the cells, and connected to the cells; and second general purpose pads arranged in an adjacent manner to the power supply pads in the corner section at a second pitch wider than the first pitch.

6. A semiconductor device according to claim 5, wherein the power supply pads and the second general purpose pads are alternately arranged.

7. A semiconductor device according to claim 6, wherein the power supply pads and the second general purpose pads are arranged at the first pitch.

8. A semiconductor device according to claim 5, wherein the cells comprise at least one of signal circuits and power supply circuits connecting the pads to power supply interconnects.

9. A semiconductor device according to claim 5, wherein the first and second general purpose pads are pads which are subjected to bonding with a wire and the power supply pads are pads which are not subjected to bonding with a wire.

10. A semiconductor device comprising:

signal circuits and power supply circuits which are arranged along a periphery of a semiconductor chip;

power supply pads arranged in a corner section of the semiconductor chip, and connected to the power supply circuits;

first general purpose pads arranged along the periphery of the semiconductor chip except the corner section thereof in a corresponding manner to the signal circuits and power supply circuits, and connected to one of the signal circuits and the power supply circuits; and second general purpose pads arranged in an adjacent manner to the power supply pads in the corner section.

11. A semiconductor device according to claim 10, wherein the power supply pads and the second general purpose pads are alternately arranged.

12. A semiconductor device according to claim 11, wherein the power supply pads and the second general purpose pads are arranged at a second pitch.

13. A semiconductor device according to claim 10, wherein the first and second general purpose pads are pads which are subjected to bonding with a wire and the power supply pads are pads which are not subjected to bonding with a wire.

14. A semiconductor device comprising:

power supply pads, arranged in a corner section of a semiconductor chip, and connected to power supply interconnects;

first general purpose pads arranged at a first pitch along a periphery of the semiconductor chip except the corner section thereof, and connected to one of signal circuits and power supply circuits; and second general purpose pads arranged in an adjacent manner to the power supply pads in the corner section at a second pitch wider than the first pitch, and connected to one of signal circuits and power supply circuits.

15. A semiconductor device according to claim 14, wherein the power supply pads and the second general purpose pads are alternately arranged.

16. A semiconductor device according to claim 15, wherein the power supply pads and the second general purpose pads are arranged at the first pitch.

17. A semiconductor device according to claim 14, wherein the first and second general purpose pads are pads which are subjected to bonding with a wire and the power supply pads are pads which are not subjected to bonding with a wire.

* * * * *